(12) United States Patent
Owyang et al.

(10) Patent No.: US 8,928,138 B2
(45) Date of Patent: Jan. 6, 2015

(54) COMPLETE POWER MANAGEMENT SYSTEM IMPLEMENTED IN A SINGLE SURFACE MOUNT PACKAGE

(75) Inventors: King Owyang, Atherton, CA (US); Mohammed Kasem, Santa Clara, CA (US); Yuming Bai, Union City, CA (US); Frank Kuo, Kaoshiung (TW); Sen Mao, Kaoshiung (TW); Sam Kuo, Ping-Dong (TW)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 12/779,815

(22) Filed: May 13, 2010

(65) Prior Publication Data
US 2010/0219519 A1    Sep. 2, 2010

Related U.S. Application Data

(63) Continuation of application No. 11/479,671, filed on Jun. 30, 2006.

(60) Provisional application No. 60/696,037, filed on Jul. 1, 2005.

(51) Int. Cl.
*H01L 23/34* (2006.01)
*H01L 25/16* (2006.01)
(Continued)

(52) U.S. Cl.
CPC ............... *H01L 25/16* (2013.01); *H01L 23/36* (2013.01); *H01L 23/49861* (2013.01); *H01L 24/49* (2013.01); *H05K 1/141* (2013.01); *H01L 2224/48091* (2013.01); *H01L 2224/48227* (2013.01); *H01L 2224/48247* (2013.01);
(Continued)

(58) Field of Classification Search
USPC .................. 257/723, 666–676, 724, E23.141
See application file for complete search history.

(56) References Cited

U.S. PATENT DOCUMENTS 4,978,867 A * 12/1990 Pfennings ...................... 327/540
5,629,563 A    5/1997 Takiar et al.
(Continued)

FOREIGN PATENT DOCUMENTS

DE       4410212       9/1995
GB       1255073       11/1971
(Continued)

OTHER PUBLICATIONS

Owyang et al., US Patent Application filed Jun. 30, 2006; U.S. Appl. No. 11/479,619.

*Primary Examiner* — Jasmine Clark

(57) ABSTRACT

A complete power management system implemented in a single surface mount package. The system may be drawn to a DC to DC converter system and includes, in a leadless surface mount package, a driver/controller, a MOSFET transistor, passive components (e.g., inductor, capacitor, resistor), and optionally a diode. The MOSFET transistor may be replaced with an insulated gate bipolar transistor, IGBT in various embodiments. The system may also be a power management system, a smart power module or a motion control system. The passive components may be connected between the leadframe connections. The active components may be coupled to the leadframe using metal clip bonding techniques. In one embodiment, an exposed metal bottom may act as an effective heat sink.

19 Claims, 17 Drawing Sheets

(51) Int. Cl.
    *H01L 23/36*     (2006.01)
    *H01L 23/498*     (2006.01)
    *H01L 23/00*     (2006.01)
    *H05K 1/14*     (2006.01)
    *H02M 3/00*     (2006.01)
    *H05K 1/02*     (2006.01)
    *H05K 1/18*     (2006.01)
    *H05K 3/20*     (2006.01)
    *H05K 3/28*     (2006.01)
    *H05K 3/34*     (2006.01)

(52) U.S. Cl.
CPC ............... *H01L 2224/48465* (2013.01); *H01L 2224/49171* (2013.01); *H01L 2224/49175* (2013.01); *H01L 2224/73265* (2013.01); *H01L 2924/01013* (2013.01); *H01L 2924/01014* (2013.01); *H01L 2924/01029* (2013.01); *H01L 2924/01033* (2013.01); *H01L 2924/0106* (2013.01); *H01L 2924/01075* (2013.01); *H01L 2924/01078* (2013.01); *H01L 2924/01079* (2013.01); *H01L 2924/01082* (2013.01); *H01L 2924/13055* (2013.01); *H01L 2924/13091* (2013.01); *H01L 2924/14* (2013.01); *H01L 2924/15311* (2013.01); *H01L 2924/19041* (2013.01); *H01L 2924/19105* (2013.01); *H01L 2924/30107* (2013.01); *H02M 3/00* (2013.01); *H05K 1/0206* (2013.01); *H05K 1/0218* (2013.01); *H05K 1/181* (2013.01); *H05K 3/202* (2013.01); *H05K 3/284* (2013.01); *H05K 3/3436* (2013.01); *H05K 2201/10166* (2013.01); *H01L 24/48* (2013.01); *H01L 2224/32225* (2013.01); *H01L 2924/01006* (2013.01); *H01L 2924/014* (2013.01); *H01L 2224/32245* (2013.01); *H01L 2224/48137* (2013.01); *H01L 2924/10253* (2013.01); *H01L 2924/15747* (2013.01)
USPC ...... 257/723; 257/676; 257/724; 257/E23.141

(56) References Cited

U.S. PATENT DOCUMENTS

| | | | |
|---|---|---|---|
| 5,753,529 A | 5/1998 | Chang et al. | |
| 5,757,081 A | 5/1998 | Chang et al. | |
| 5,847,951 A | 12/1998 | Brown et al. | |
| 6,066,890 A | 5/2000 | Tsui et al. | |
| 6,271,060 B1 | 8/2001 | Zandman et al. | |
| 6,278,400 B1 | 8/2001 | Cassen et al. | |
| 6,307,272 B1 | 10/2001 | Takahashi et al. | |
| 6,313,520 B1 | 11/2001 | Yoshida et al. | |
| 6,313,598 B1 | 11/2001 | Tamba et al. | |
| 6,316,287 B1 | 11/2001 | Zandman et al. | |
| 6,330,165 B1 | 12/2001 | Kohjiro et al. | |
| 6,351,033 B1 | 2/2002 | Lotfi et al. | |
| 6,441,475 B2 | 8/2002 | Zandman et al. | |
| 6,448,643 B2 | 9/2002 | Cheah et al. | |
| 6,462,522 B2 | 10/2002 | Burstein et al. | |
| 6,524,886 B2 | 2/2003 | Lee | |
| 6,562,647 B2 | 5/2003 | Zandman et al. | |
| 6,713,676 B2 | 3/2004 | Fischer | |
| 6,798,180 B2 | 9/2004 | Sase et al. | |
| 6,876,061 B2 | 4/2005 | Zandman et al. | |
| 6,888,064 B2 | 5/2005 | Gilliland | |
| 6,940,724 B2 | 9/2005 | Divakar et al. | |
| 6,949,835 B2 | 9/2005 | Konishi et al. | |
| 6,992,528 B2 | 1/2006 | Akamine et al. | |
| 7,091,606 B2 * | 8/2006 | Sakamoto et al. | 257/723 |
| 7,211,877 B1 | 5/2007 | Zandman et | |
| 7,242,076 B2 | 7/2007 | Dolan | |
| 7,304,370 B2 | 12/2007 | Imaizumi et al. | |
| 7,489,021 B2 | 2/2009 | Juskey et al. | |
| 7,741,710 B2 * | 6/2010 | Ichitsubo et al. | 257/724 |
| 7,852,185 B2 | 12/2010 | Gardner et al. | |
| 8,471,381 B2 | 6/2013 | Owyang et al. | |
| 2002/0073032 A1 | 6/2002 | Holmes et al. | |
| 2004/0075169 A1 | 4/2004 | Yamada et al. | |
| 2004/0125576 A1 | 7/2004 | Lin et al. | |
| 2004/0212074 A1 | 10/2004 | Divakar et al. | |
| 2005/0029617 A1 | 2/2005 | Kameda et al. | |
| 2005/0073032 A1 | 4/2005 | Tao | |
| 2005/0156204 A1 | 7/2005 | Uno et al. | |
| 2005/0173783 A1 * | 8/2005 | Chow et al. | 257/666 |
| 2006/0145319 A1 | 7/2006 | Sun et al. | |
| 2007/0063340 A1 | 3/2007 | Owyang et al. | |

FOREIGN PATENT DOCUMENTS

| | | |
|---|---|---|
| JP | 08 340193 | 12/1996 |
| JP | 8340193 | 12/1996 |
| JP | 2004140305 | 5/2004 |
| JP | 2004-228402 | 8/2004 |
| JP | 2006049569 | 2/2006 |
| TW | 485586 | 5/2002 |
| TW | 200504983 | 2/2005 |
| WO | 0016398 | 3/2000 |

* cited by examiner

COMPLETE POWER MANAGEMENT SYSTEM IMPLEMENTED IN A SINGLE SURFACE MOUNT PACKAGE

RELATED APPLICATIONS

This Application is a Continuation of U.S. patent application Ser. No. 11/479,671, filed Jun. 30, 2006, and now U.S. Pat. No. 8,471,381 issued on Jun. 25, 2013, which claims the benefit of U.S. Provisional Patent Application No. 60/696,037, filed Jul. 1, 2005, which are hereby incorporated herein by reference in their entirety.

This Application is related to U.S. patent application Ser. No. 08/556,369, filed Nov. 13, 1995, now issued as U.S. Pat. No. 6,066,890, which is hereby incorporated herein by reference in its entirety.

FIELD

Embodiments are directed toward the field of integrated circuit devices and packaging related to power management systems.

RELATED ART

Varieties of integrated circuits are commercially available to facilitate power management tasks, for example, to control DC to DC voltage conversion or as a constant current controller.

DC/DC converter circuits are commonly used as Point Of Load (POL) power sources to drive a wide variety of semiconductor devices from a single "bulk" voltage routed around a system, for example, in an intermediate bus architecture (IBA). Generally, POL converter circuits are placed right alongside each semiconductor device and shift a single IBA voltage to the different voltage levels required by each integrated circuit. Typically, DC/DC converters drive such devices as FPGAs, microprocessors, DSPs, ADCs, SDRAMs, up/down converters, etc.

DC/DC converter circuits are also frequently used in systems comprising rechargeable batteries. Theses applications are characterized by portability (size, weight, etc.) and length of service from a single charge. For example, the efficiency of the DC/DC converter circuit directly affects the standby and talk time available from a cell phone between battery charges.

Current control products generally fall into two categories: constant current controllers and constant current sources. A constant current controller accepts a constant DC voltage and converts it to a constant current output. When the input voltage is subject to variation or instability a DC/DC converter is first used to steady the DC voltage and then the constant current controller takes that steady voltage and puts out a constant current. A constant current source generally comprises a DC/DC converter and a constant current controller.

DC/DC converters and current controllers offered by many integrated circuit (IC) manufacturers are silicon chips that provide only the basic operation for circuit functions. An end user must then select up to about 22 other components that surround the integrated circuit in order to create a complete circuit solution. The selection of these components and the circuit board layout affect the final performance in such critical areas as efficiency, ripple voltage, reliability, etc. Unfortunately, these critical features as defined by the integrated circuit manufacturer may not be the same as the performance features achieved when the customer completes the circuit on the board with the addition of external components. Consequently, because the user's assemblage of parts does not become a complete circuit function until the first time all parts come together, e.g., on a printed circuit board, the function must be tested as a subsystem function on the board.

Vishay Intertechnology, Inc., of Malvern, Pa., currently offers several versions of the FunctionPAK® DC/DC converters and current control modules. FunctionPAK® products are complete power management systems in single surface mount, e.g., BGA, packages. Advantageously, this product is a complete power management function in a single module. The single package contains all circuit components and is fully tested with all circuit parameters defined exactly as used in the customer's system.

FunctionPAK® power management products generally comprise multi-chip module (MCM) circuit packaging. In general, the term MCM refers to a package comprising two or more circuit elements, usually including at least one integrated circuit, and an interconnecting substrate to couple the circuit elements and the package contacts. MCM devices conventionally include, for example, laminated substrates, e.g., FR4 printed circuit boards, thin film depositions, surface laminar circuitry (SLC) and/or ceramic substrates.

FIG. 1A illustrates a top view of an exemplary MCM comprising many separate chip devices, passive components and other items mounted on a multilayer printed circuit board (PCB). For example, the exemplary MCM comprises an integrated circuit device 1, an inductor 2, a plurality of passive components, e.g., resistors and/or capacitors, 3, and a multilayer printed circuit board (PCB) 4. The devices and printed circuit board can be molded in plastic producing a single package. FIG. 1A also shows a side sectional view of components molded in plastic encapsulant 5.

FIG. 1B illustrates another top view of an exemplary MCM.

FIG. 1C illustrates a bottom view of an exemplary PCB for use in a multi-chip module that utilizes a ball grid array (BGA) packaging technique. FIG. 1C illustrates an exemplary ball grid array ball 6, used as a package contact to couple circuitry of the multi-chip module to a next electronic assembly, e.g., other components mounted to a processor "mother" board. FIG. 1C illustrates an exemplary wiring trace 7, which serves to couple the various components of the MCM and the package contacts, e.g., "balls."

FunctionPAK® or MCM provides complete solutions and offers many advantages, e.g., the MCM saves space and weight, simplifies end product design/development, reduces component count, reduces assembly costs and saves test time, and speeds time-to-market.

The current FunctionPAK® power management products based on MCM design may, in some instances, have several electrical and thermal limitations as follows: 1) undesirable parasitic resistance due to thin copper layer; 2) undesirable parasitic inductance due to the pins of the package; limited current carrying capacity; 3) undesirable decreased efficiency due to the combined effects from the parasitic and the poor thermal performance; 4) undesirable power density because packaged silicon devices (control driver and power MOSFETs) are used which are encapsulated in a poor thermal conductive mold material; 5) undesirable switching frequency due to high switching loss, which limits the operating temperature and current rating; and 6) undesirable thermal performance due to poor thermal conductivity of the materials used. In addition, the design of the FunctionPAK® MCM using a multilayer PCB as a substrate with BGA re-routed connections may provide poor thermal efficiency and poor heat sinking. As a result, the operation and reliability of the circuit and active devices can be impacted. As discussed above, when the MCM is molded in plastic, the heat dissipation elements of each individual component become rendered ineffective.

FIG. 2A illustrates another design that utilizes surface mount components (mounted on copper) for a MOSFET device (high side 11 and low side 12) and a driver/controller 10 for a DC to DC converter system. However, this solution is not a complete power management system, as it does not include the passive components required in such a system.

FIG. 2B illustrates the packaged top side 20 of the design of FIG. 2A and an x-ray view 30 from the same perspective.

FIG. 2C illustrates a package mechanical drawing of the design of FIGS. 2A and 2B. Package bottom view 34 illustrates the metal bottom, or lead frame, used has a heat sink (31, 32 and 33). Unfortunately, this design does not provide a complete system solution because the passive components required for a complete design are not included.

SUMMARY

Accordingly, a complete power management system is described herein and is implemented using a surface mount package. The system may be drawn to a DC to DC converter system and includes, in a surface mount package, a driver/controller, a MOSFET transistor, passive components (e.g., inductor, capacitor, resistor), and optionally a diode. The MOSFET transistor may be replaced with an insulated gate bipolar transistor, IGBT, in various embodiments. The system may also be a power management system, a smart power module, a current controller or a motion control system. The passive components may be connected between the leadframe connections. The active components may be coupled to the leadframe using metal clip bonding techniques. In one embodiment, an exposed metal bottom may act as an effective heat sink.

The advantages of using the surface mount packaging include higher current rating, reduced parasitic effects and higher efficiency. In addition, embodiments offer higher power dissipation, lower thermal resistance and a smaller footprint on a next level assembly. Embodiments also offer lower assembly cost.

According to embodiments, a standard surface mount package (SMP) is used with exposed metal bottom. The package may employ a copper lead frame to replace a multilayer FR4 substrate material (PCB) and the BGA connections. As a result, the assembly process is simplified and the product cost is reduced. In addition and the performance and reliability of the DC-DC converter is greatly enhanced.

The use of SMP has many advantages. The copper lead frame in the package is much thicker than that used in the MCM FunctionPAK®. Therefore, the parasitic resistance is significantly reduced compared to the conventional FunctionPAK®. Another advantage is to use metal (e.g., copper) clips on the source and drain of the MOSFET that improve thermal and electrical performance of the MOSFET. The metal clips can also be used on the diode. Also, SMP can handle much more current than MCM FunctionPAK®, because higher current causes more power loss, which cannot be dissipated by the high thermal resistivity of MCM FunctionPAK® construction.

Moreover, SMP can produce higher efficiency because it significantly reduces the parasitic inductance and the related switching loss, and it has good thermal performance. Also, SMP has higher power density because its good thermal performance can dissipate more power and it is more compact because the silicon dice are packageless. Also, SMP can make the circuit operate at higher switching frequency because it reduces the switching loss and it has much lower thermal resistivity.

SMP eliminates the internal packaging requirements of the electrical components. Without the internal package, the bare circuit components will have better thermal performance due to the high thermal conductivity of the lead frame and better electrical performance due to the less parasitic inductance. In addition, SMP can lead to less cost because there is no need for internal package.

The SMP embodiments can be extended to provide a new integrated platform for the applications of power MOSFETs, such as power management, smart (intelligent) power modules, DC-DC converters and motion control systems, among some exemplary uses.

DETAILED DESCRIPTION

Reference will now be made in detail to embodiments, complete power management system implemented in a single surface mount package, examples of which are illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding of the disclosure. However, it will be recognized by one of ordinary skill in the art that embodiments may be practiced without these specific details. In other instances, well-known methods, procedures, components, and circuits have not been described in detail as not to unnecessarily obscure aspects of the disclosure.

Figure 1A:
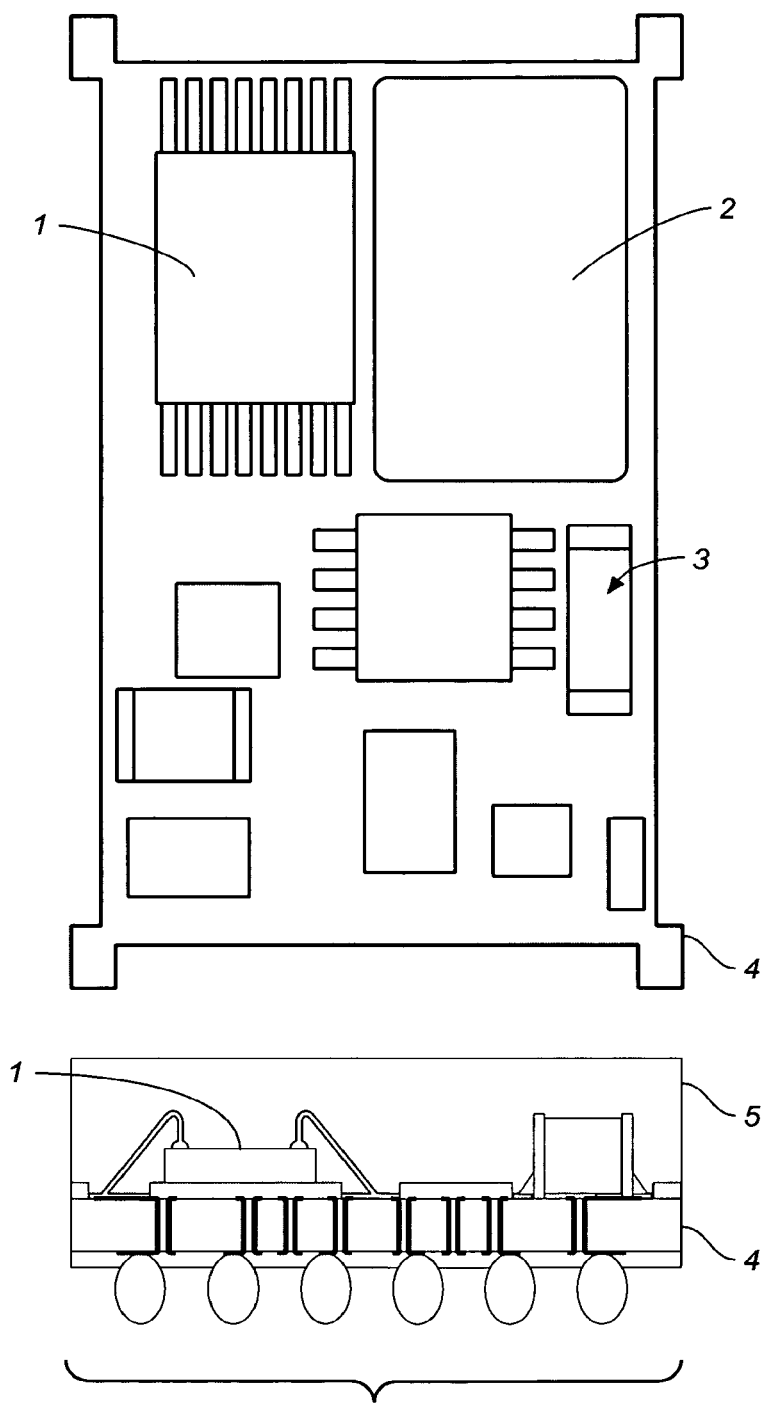
FIG. 1A is a non-molded view of the MCM of the prior art.
Figure 1B:
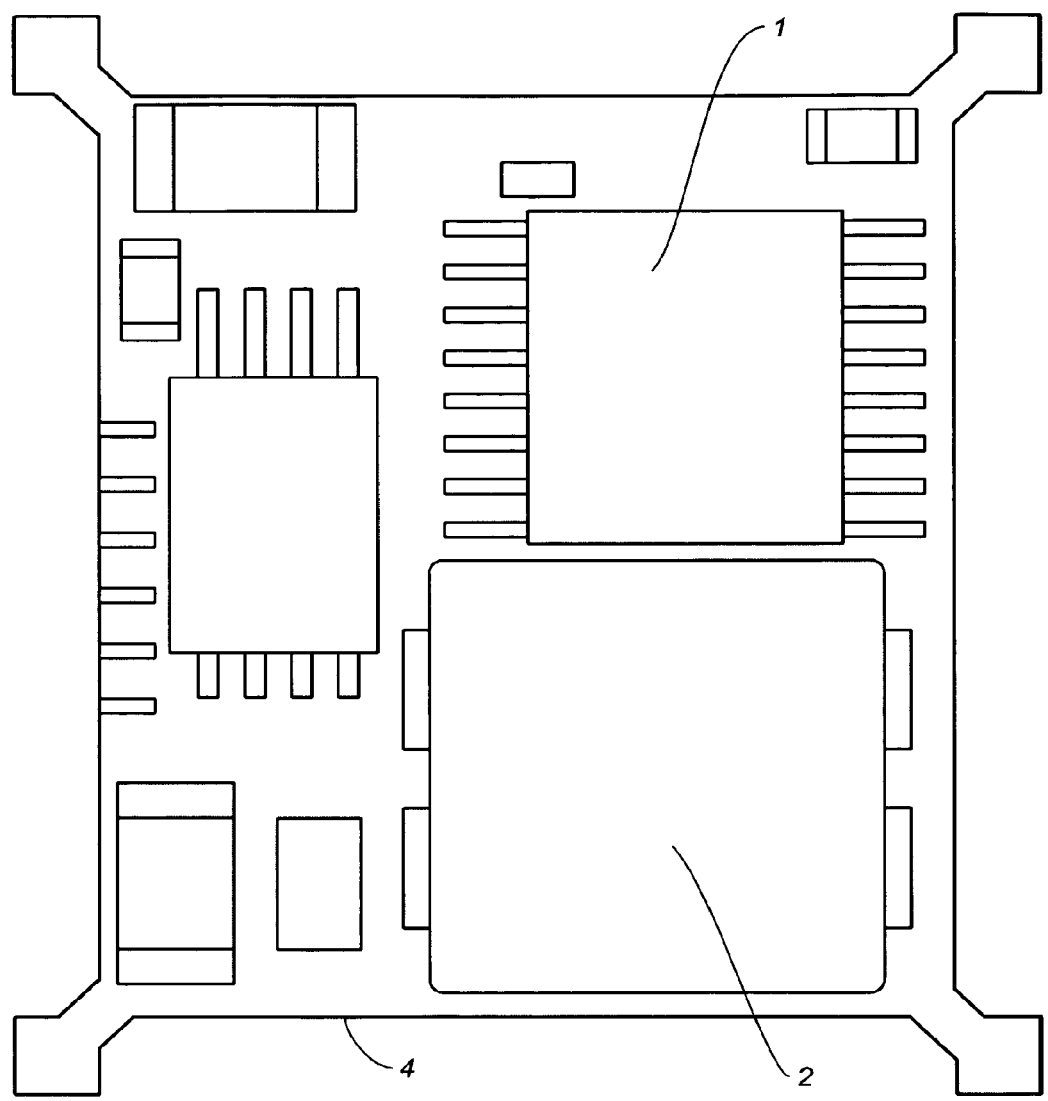
FIG. 1B is a non-molded view of the MCM of the prior art.
Figure 1C:
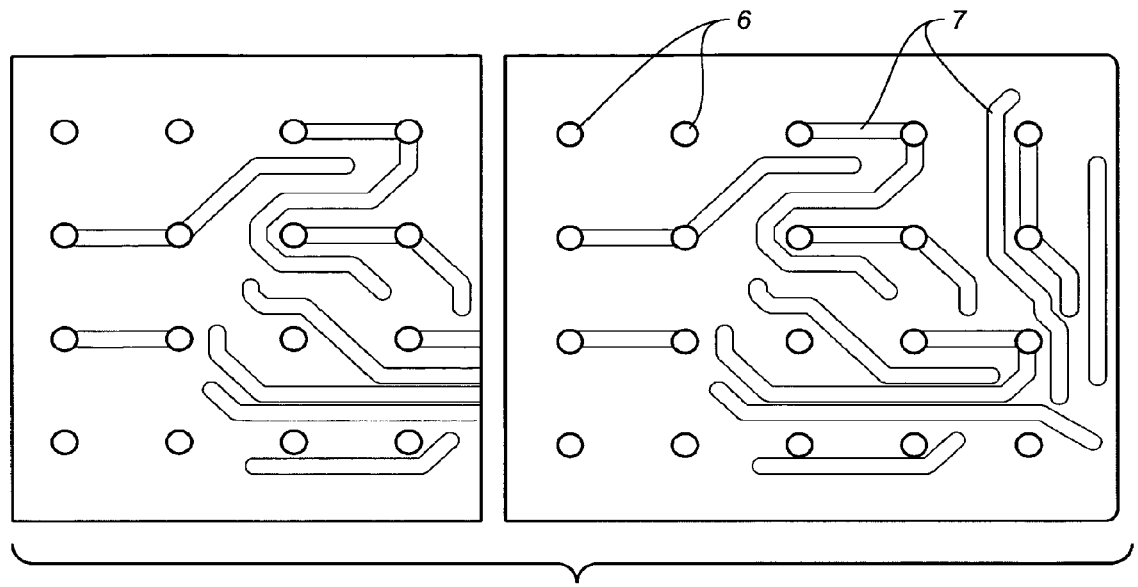
FIG. 1C is a bottom view of the BGA of the MCM of the prior art.
Figure 2A:
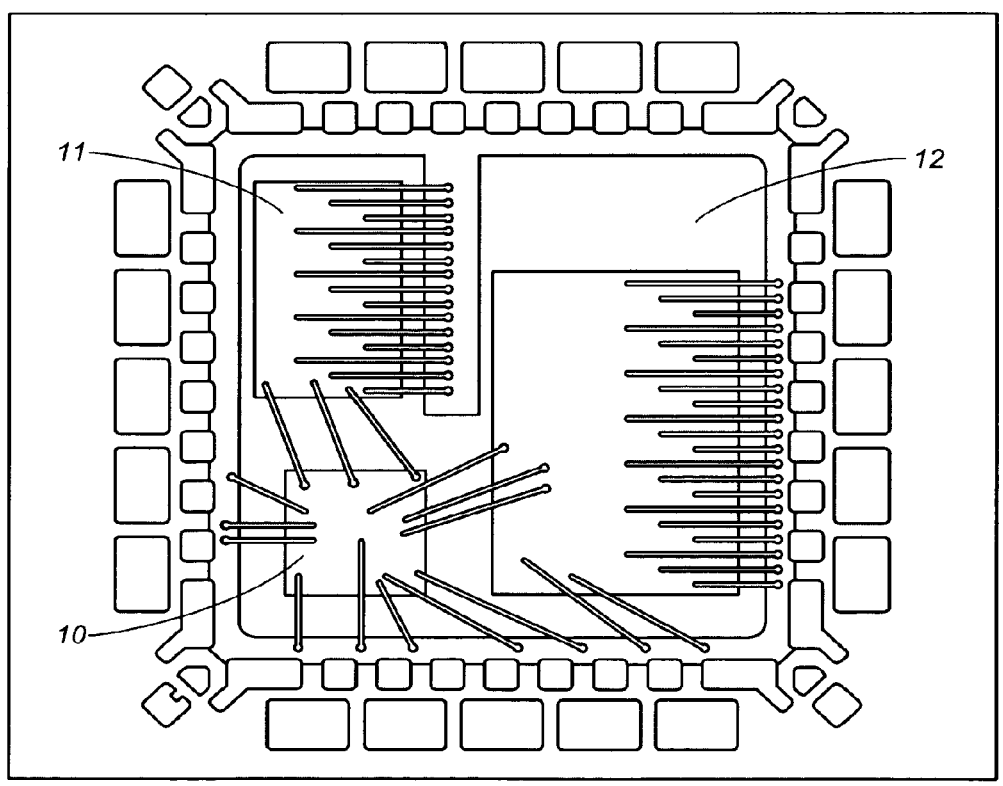
FIG. 2A is a top view of the incomplete system of the prior art using surface mount technology.
Figure 2B:
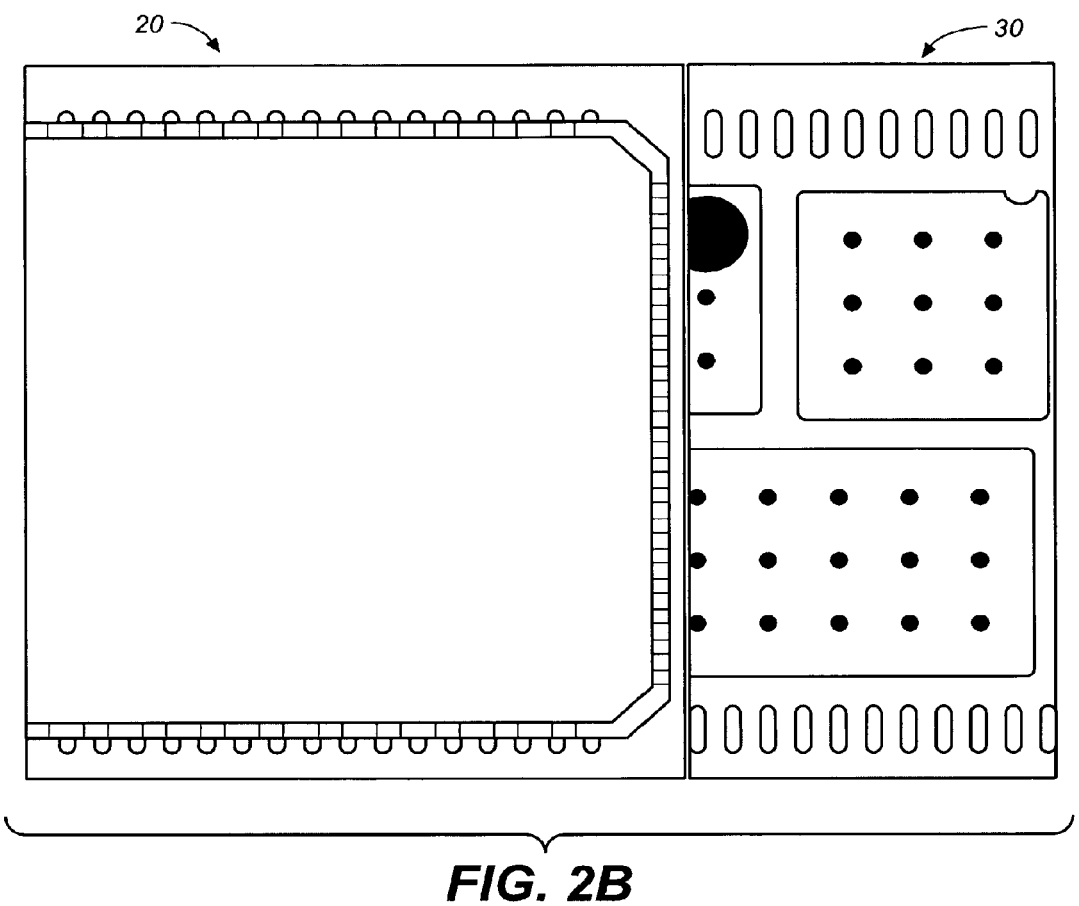
FIG. 2B is a top view of the prior art design of FIG. 2A.
Figure 2C:
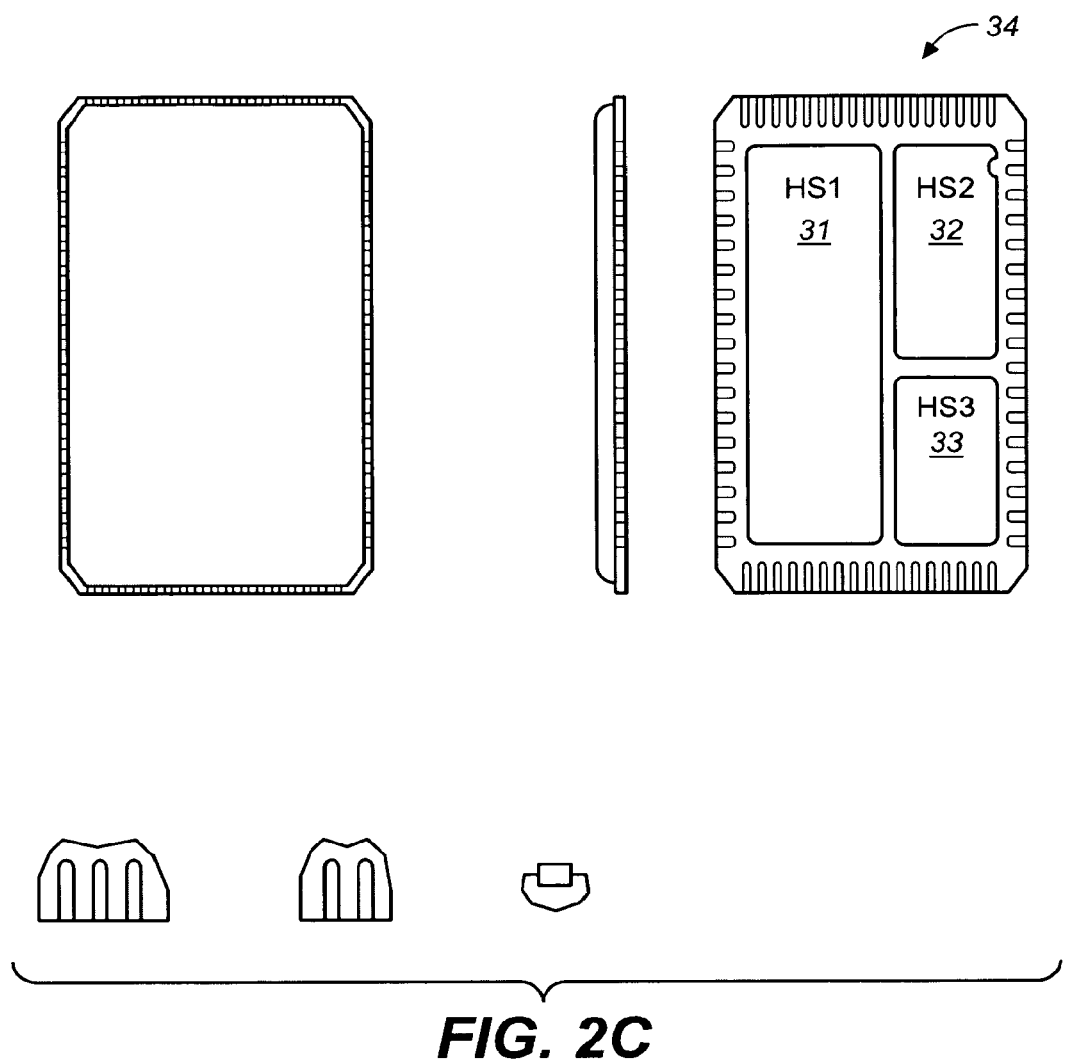
FIG. 2C is a top and bottom view of the prior art design of FIG. 2A.
Figure 3A:
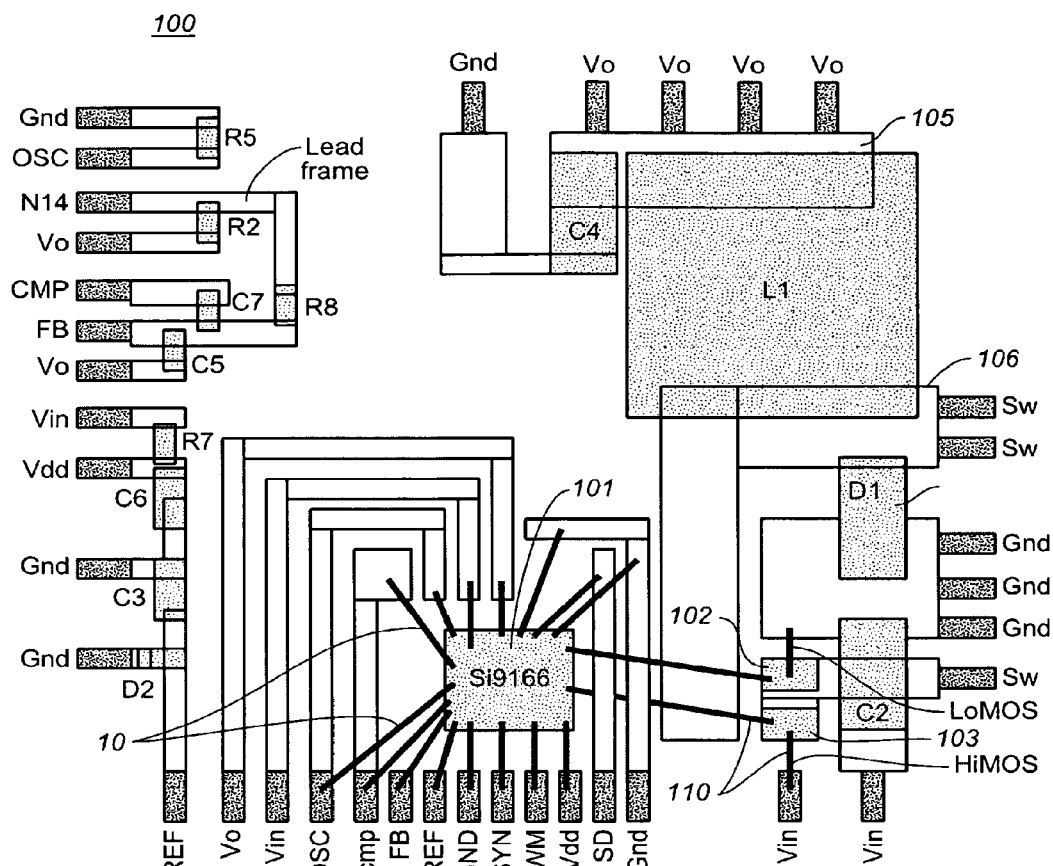
FIG. 3A and FIG. 3B illustrate embodiments for a complete power management system utilizing leadless surface mount packaging with metal bottom.
Figure 3B:
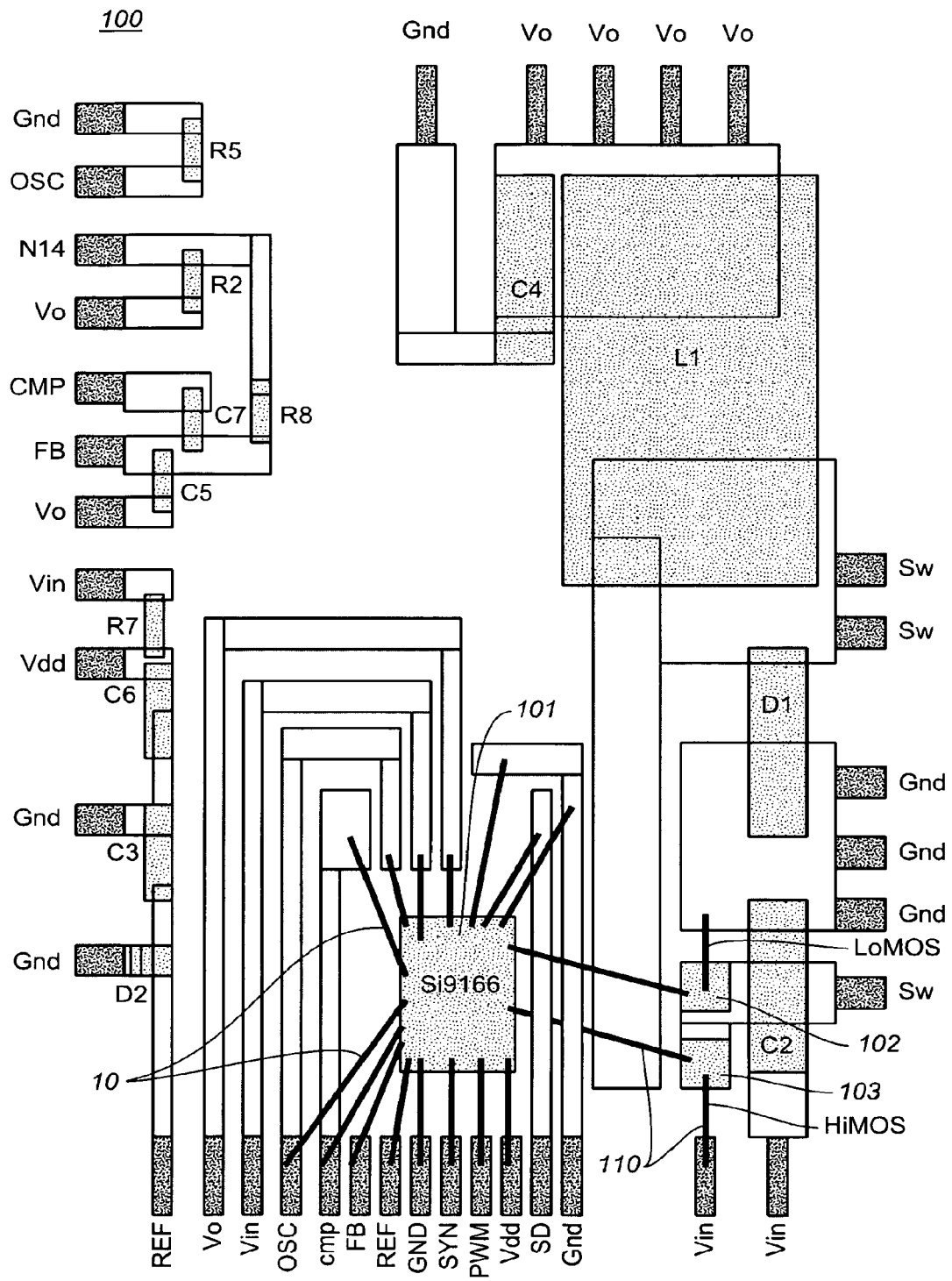

FIG. 3A and FIG. 3B illustrate embodiments for a complete power management system 100 utilizing leadless surface mount packaging with metal bottom. The system may be any power management application, e.g., a DC to DC converter, a constant current controller, a motion control system, or a smart power module, etc. According to the embodiment of FIG. 3A, the system includes a controller/driver integrated circuit 101, e.g., the integrated circuit portion of the Vishay Siliconix Si9166 "High Frequency Programmable Topology Controller," a MOSFET transistor (HiMOS 103 and LoMOS 102), and a plurality of passive components where Cn are capacitors, Ln are inductors and Rn are resistors. Advantageously, the passive components are connected between the lead posts of the metal leadframe configuration as shown by L1, etc.

For example, inductor L1 is shown disposed between leadframe portion 105 and leadframe portion 106. It is to be appreciated that inductor L1 may be electrically coupled to leadframe portion 105 and leadframe portion 106, in accordance with embodiments. Optionally, a diode D1 may be connected in a similar manner. The leadframe may comprise copper or other materials suitable for leadframes, for example, aluminum, gold, and other metals and alloys. In accordance with embodiments, the lead frame may be multi-layered.

It is to be appreciated that embodiments are well suited to the use of industry standard surface mount packages for components. For example, resistors and/or capacitors may be provided in Joint Electron Device Engineering Council (JEDEC) standard packages, e.g., "0201" or "01005." Such use of standard components offers numerous advantages, including, e.g., multiple sources and readily available pick and place technology.

Embodiments may connect the passive components to the leadframe according to technology described in U.S. patent application Ser. No. 08/556,369, filed Nov. 13, 1995, now issued as U.S. Pat. No. 6,066,890, entitled "Separate Circuit Devices in an Intra-Package Configuration and Assembly Techniques," by Tsui et al., which is hereby incorporated by reference. The passive components may be connected between elements of the leadframe in order to reduce parasitic effects, e.g., inductance and/or capacitance, and to save device space, e.g., allowing the system to be reduced in size.

Embodiments may utilize metal (e.g., copper) clip bonding 110 for connecting active components to the leadframe. This increases thermal and electrical characteristics of the system. The active components include the driver/controller and the MOSFET driver.

It is appreciated that the complete power management system 100 of FIG. 3A and FIG. 3B is mounted using a leadless surface mounted package having a metal bottom, in accordance with embodiments. As described further below, the metal bottom may provide an effective heat sink for dissipating heat from the system 100. It is further appreciated that the MOSFET transistor may be replaced by an insulated gate bipolar transistor (IGBT), which can be used for motion control systems.

Figure 4:
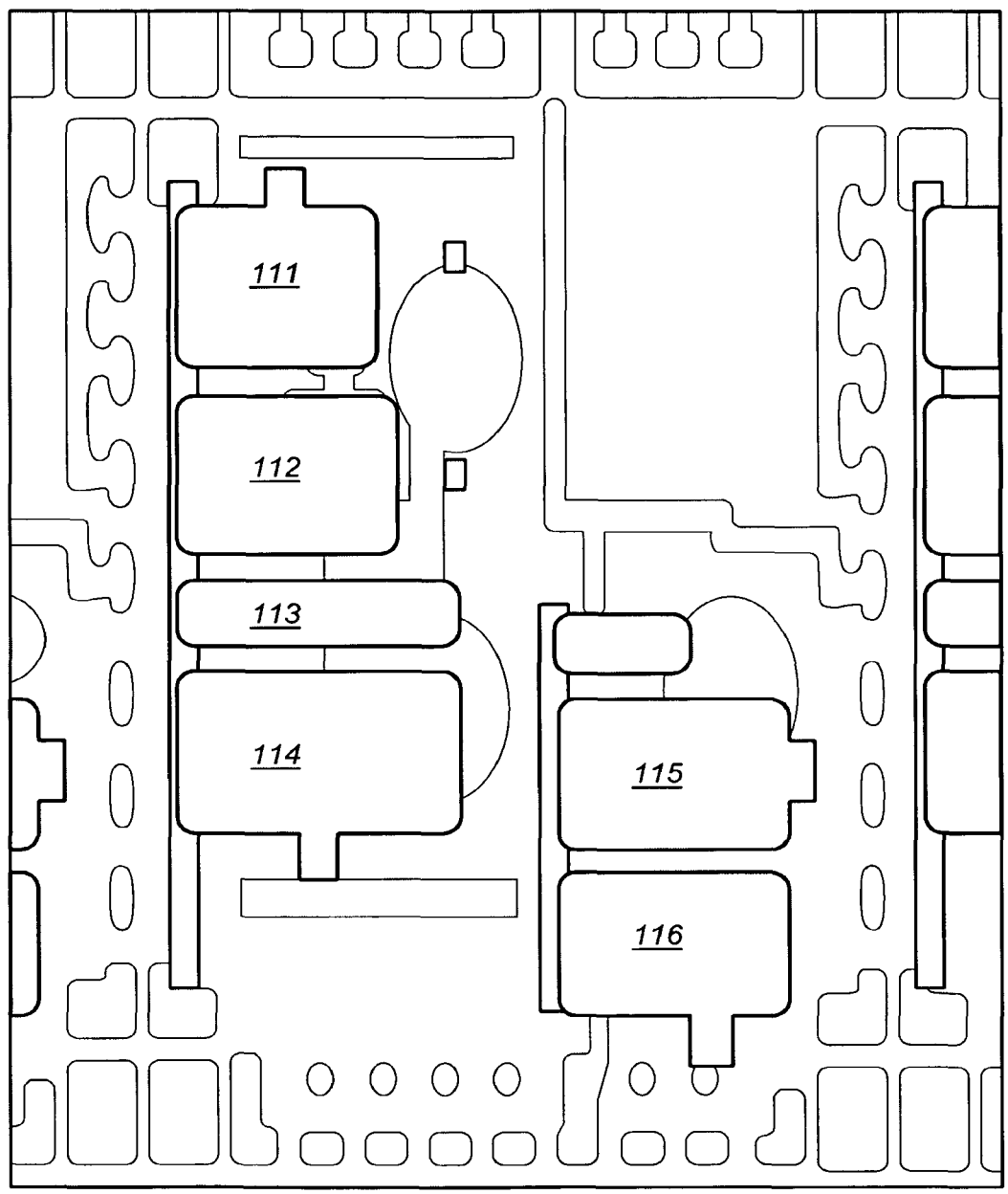
FIG. 4 illustrates the use of metal clip bonding of the active components in accordance with an embodiment to improve electrical and thermal properties of the system.

FIG. 4 illustrates a top view of the system and illustrates the use of metal clip bonding in accordance with an embodiment to improve electrical and thermal properties of the system. As described above, the active components of the system, for example., the driver/controller, e.g., driver/controller 101 of FIG. 3B, and the MOSFET transistor, e.g., LoMOS 102 of FIG. 3B and/or HiMOS 103 of FIG. 3B, may be connected to a leadframe using metal (e.g., copper) clip bonding for improving the electrical and thermal properties of the device. FIG. 4 illustrates top portions of metal clips 111, 112, 113, 114, 115 and 116. It is appreciated that the components illustrated as connected via metal clip bonding are obscured.

Figure 5:
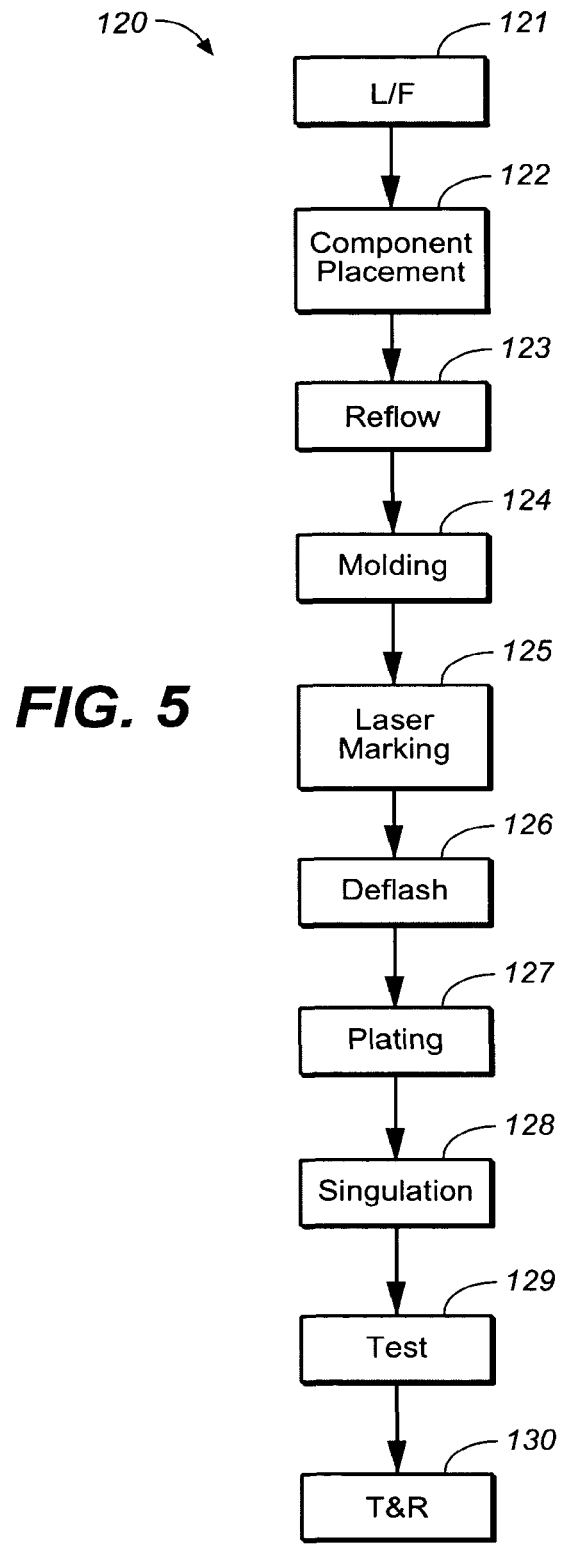
FIG. 5 illustrates a process for fabrication of the device in accordance with an embodiment.

FIG. 5 illustrates an exemplary process 120 for fabrication of the device in accordance with an embodiment. Process 120 begins with formation of a leadframe in 121. A leadframe may be formed via conventional means, e.g., stamping and bending. In 122, the components, including integrated circuit(s) and passive components are placed.

In accordance with embodiments, some components, e.g., integrated circuits, may utilize wire bond couplings to the leadframe and/or other components.

In 123, surface mount couplings are reflowed, e.g., via vapor phase or infra red processes. In 124, the devices and leadframe are overmolded with a plastic encapsulant, forming a single package. In 125, the package is laser marked for identification. In 126 excess plastic from the molding process, e.g., "flash" from mold seams or "gate" from plastic injector gates, is removed.

In 127 the exposed portions of the leadframe are plated for environmental stability and to increase their solderability for next level assembly. In 128, the packages are singulated. In 129, the devices are tested. Those devices passing the tests are then packaged 130, e.g., in tape and reel.

Figure 6:
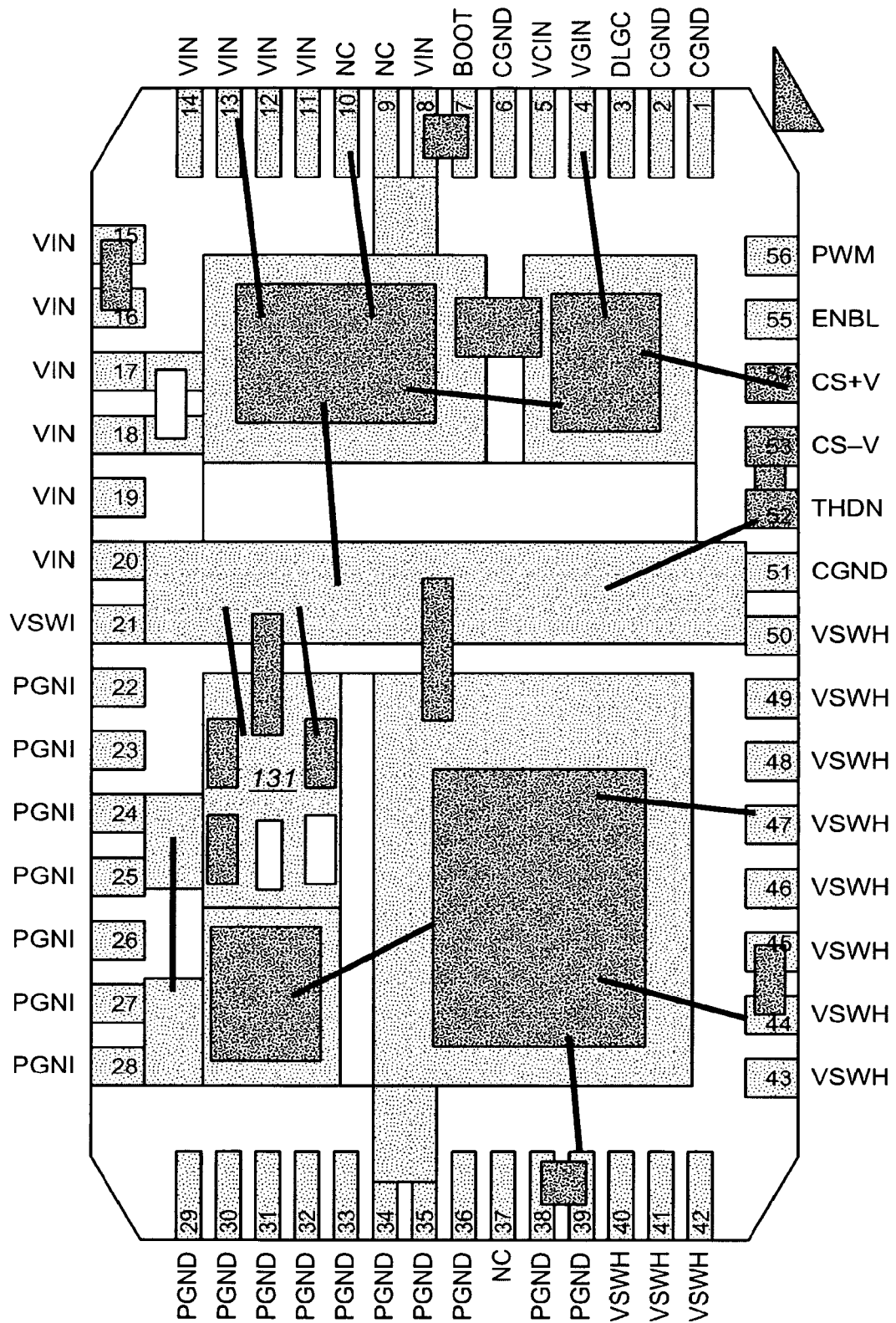
FIG. 6 illustrates the use of an electrically isolated substrate for grouping passive components with internal connection in accordance with an embodiment.

FIG. 6 illustrates the use of an electrically isolated substrate for grouping passive components with internal connection in accordance with an embodiment. In this embodiment, an electrically isolated substrate 131, e.g., ceramic, may group several passive components with internal connections. Such an isolated substrate may then be coupled to portions of the leadframe and/or other components.

Figure 7A:
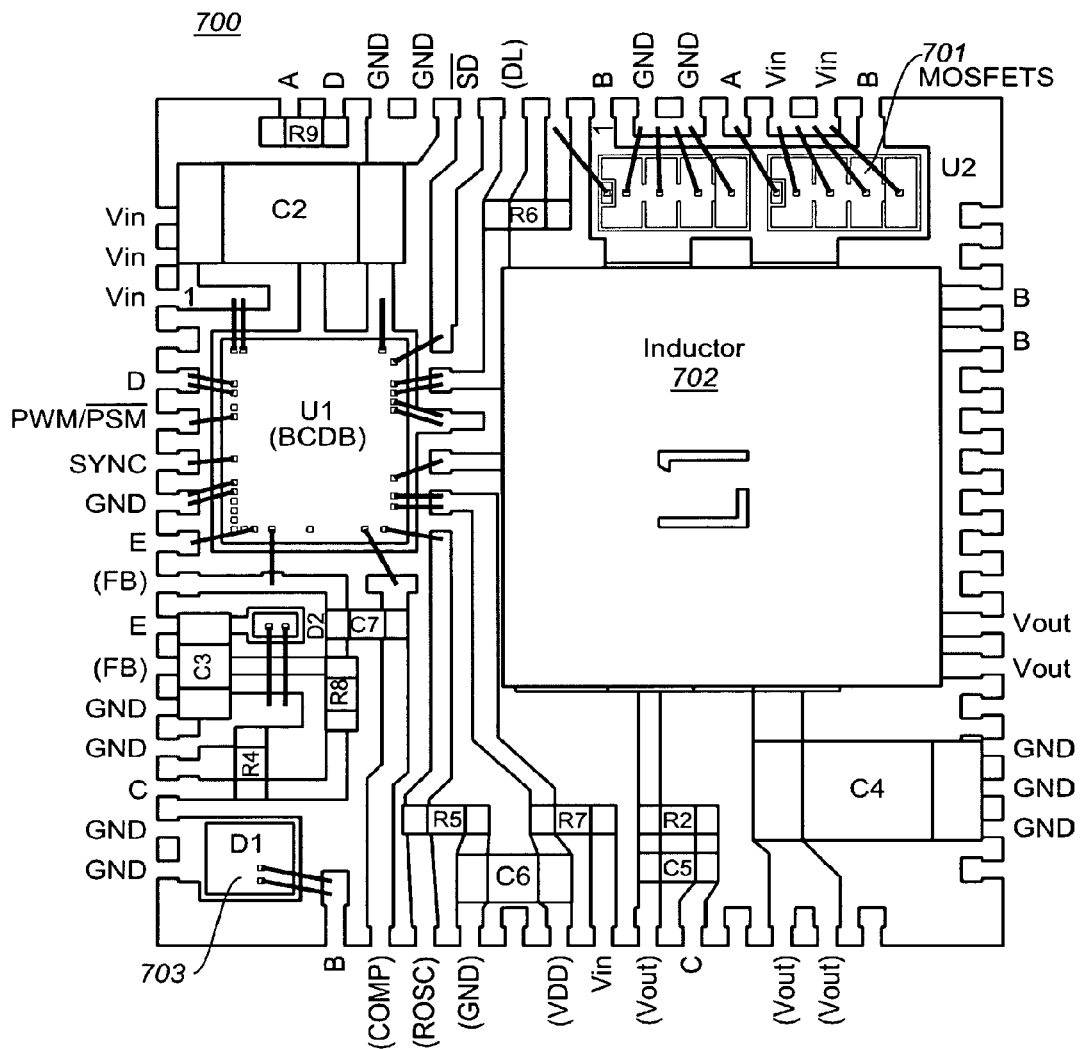
FIG. 7A and FIG. 7B illustrate plan views of embodiments.
Figure 7B:
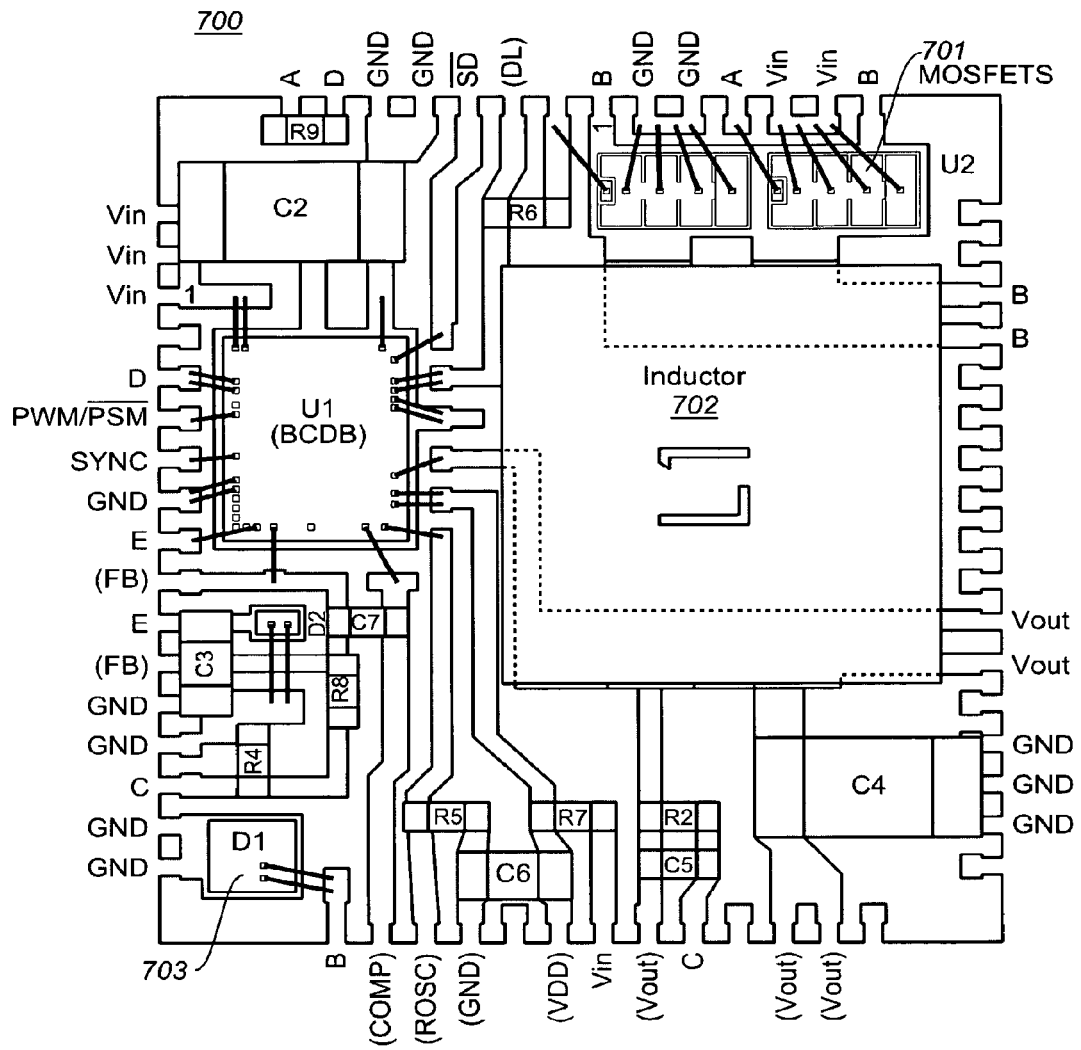

FIG. 7A and FIG. 7B illustrate plan views of complete power management system 700 in accordance with embodiments. The MOSFETs 701 are shown in the upper right corner. Inductor 702 is shown directly mounted to and "spanning" portions of the leadframe. In this example, a diode D1 703 is also used. The diode may be connected to the leadframe using the metal (e.g., copper) clip bonding techniques. FIG. 7B illustrates an exemplary design with exemplary dimensions.

Figure 8:
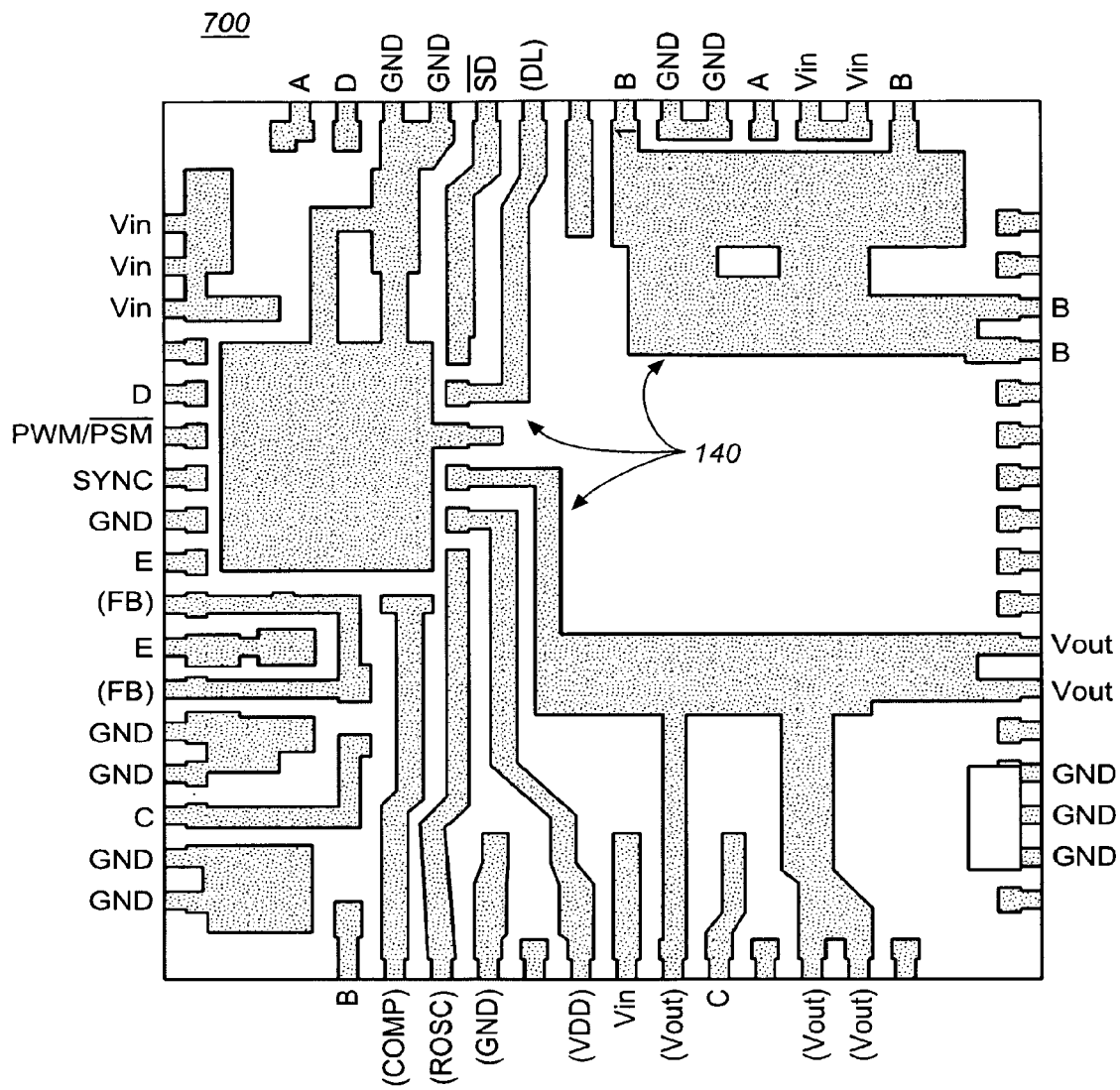
FIG. 8 illustrates the bottom view of the device in accordance with an embodiment and illustrates the exposed leadframe configuration.

FIG. 8 illustrates the bottom view of the complete system (using leadless surface mounted package) in accordance with an embodiment and illustrates the exposed leadframe configuration 140. In this embodiment, the exposed leadframe located on the bottom of the device acts as an effective heat sink for thermal dissipation.

Figure 9A:
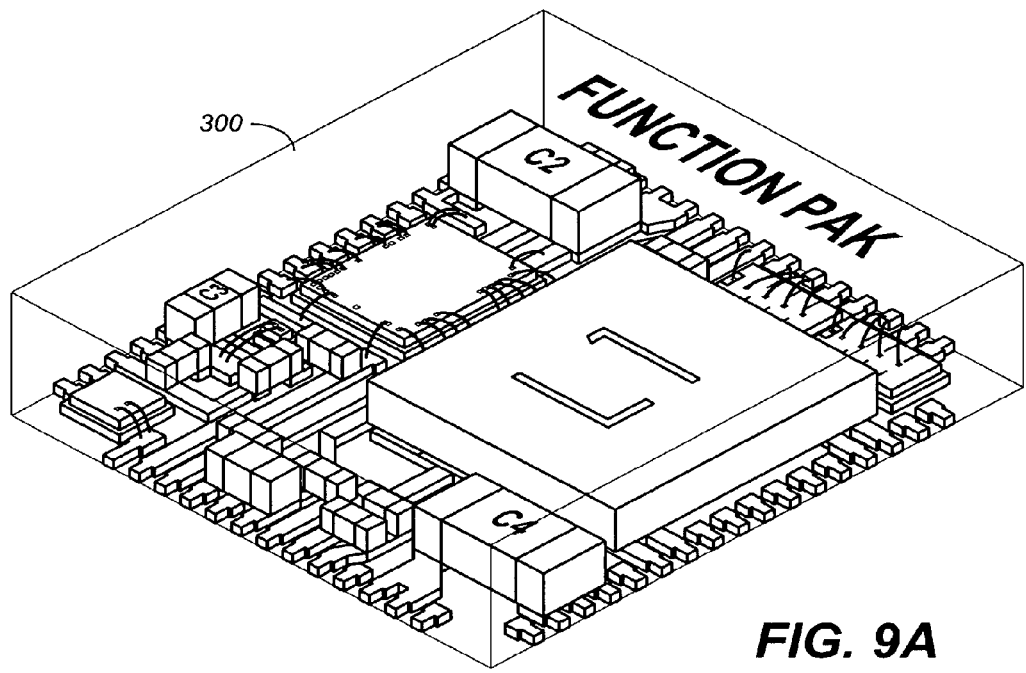
FIG. 9A illustrates a perspective view of a molded exemplary embodiment.

FIG. 9A illustrates a perspective view of a molded exemplary embodiment. In this embodiment, a device 300 comprises the system 100 with covering molded plastic packaging. The plastic molding is shown in outline, illustrating the interior components.

Figure 9B:
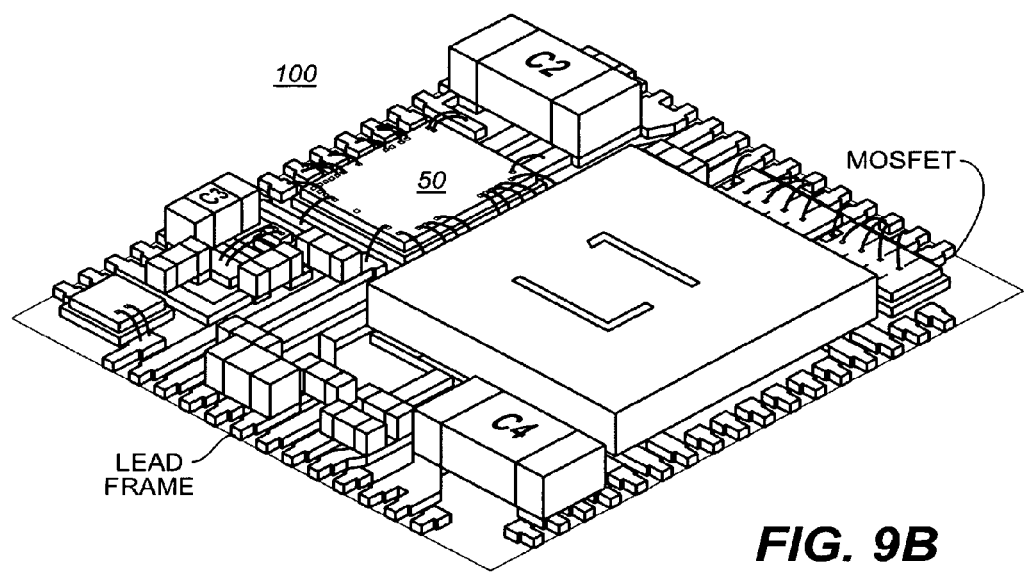
FIG. 9B illustrates a perspective view of a non-molded exemplary embodiment.

FIG. 9B illustrates a perspective view of a non-molded exemplary embodiment. Complete system 100 is shown with driver/controller 50, MOSFET transistor, and passive components, R, L and C. The driver/controller 50 is shown coupled to inductor L1. The other passive components are shown connected to the leadframe.

Figure 10A:
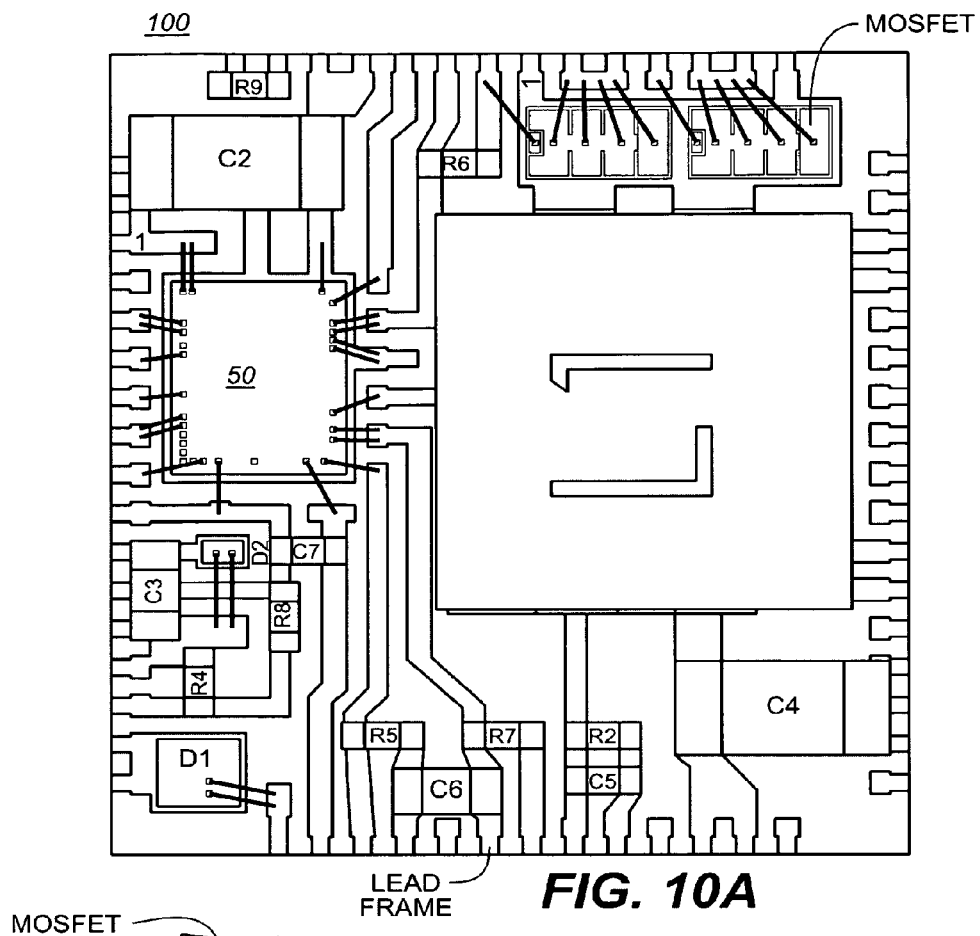
FIG. 10A illustrates a plan view of an exemplary embodiment.

FIG. 10A illustrates a plan view of an exemplary embodiment. As shown, complete system 100 comprises passive components (Cn, Ln, Rn) connected across the leadframe and also includes the driver/controller 50 and the MOSFET transistor.

Figure 10B:
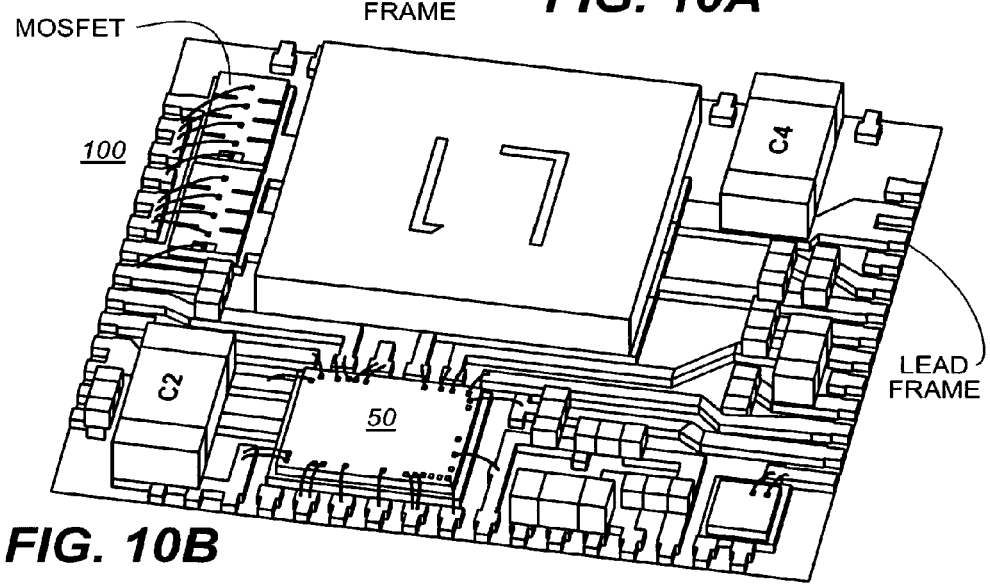
FIG. 10B illustrates a perspective view of a non-molded exemplary embodiment.

FIG. 10B illustrates a perspective view of a non-molded exemplary embodiment. As shown, complete system 100 comprises passive components (Cn, Ln, Rn) connected across the leadframe and also includes the driver/controller 50 and the MOSFET transistor.

Figure 11A:
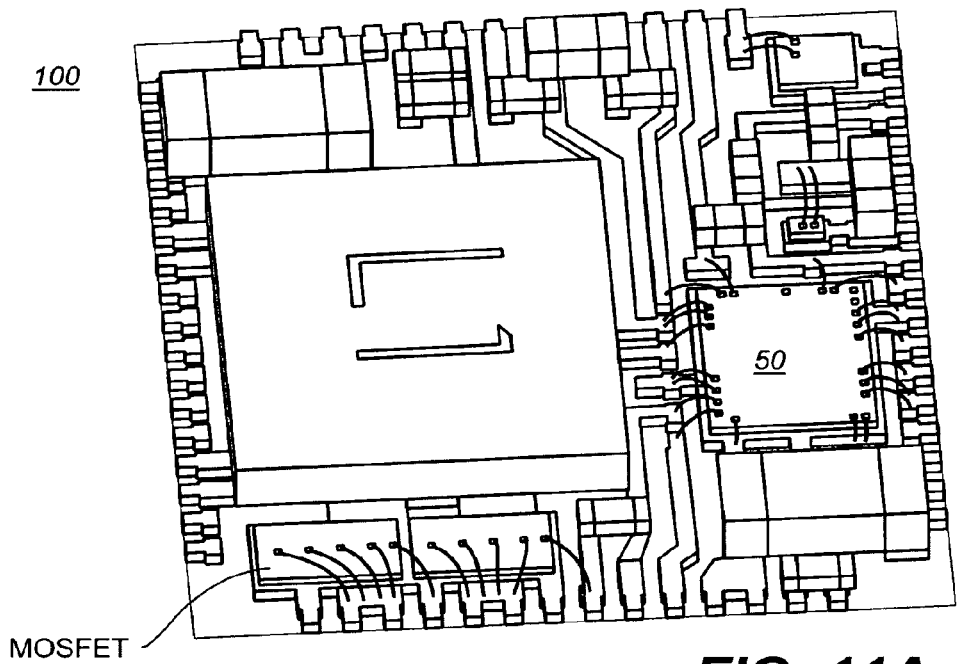
FIG. 11A illustrates a perspective view of an exemplary embodiment.

FIG. 11A illustrates a perspective view of an exemplary embodiment. As shown, complete system 100 comprises passive components (Cn, Ln, Rn) connected across the leadframe and also includes the driver/controller 50 and the MOSFET transistor.

Figure 11B:
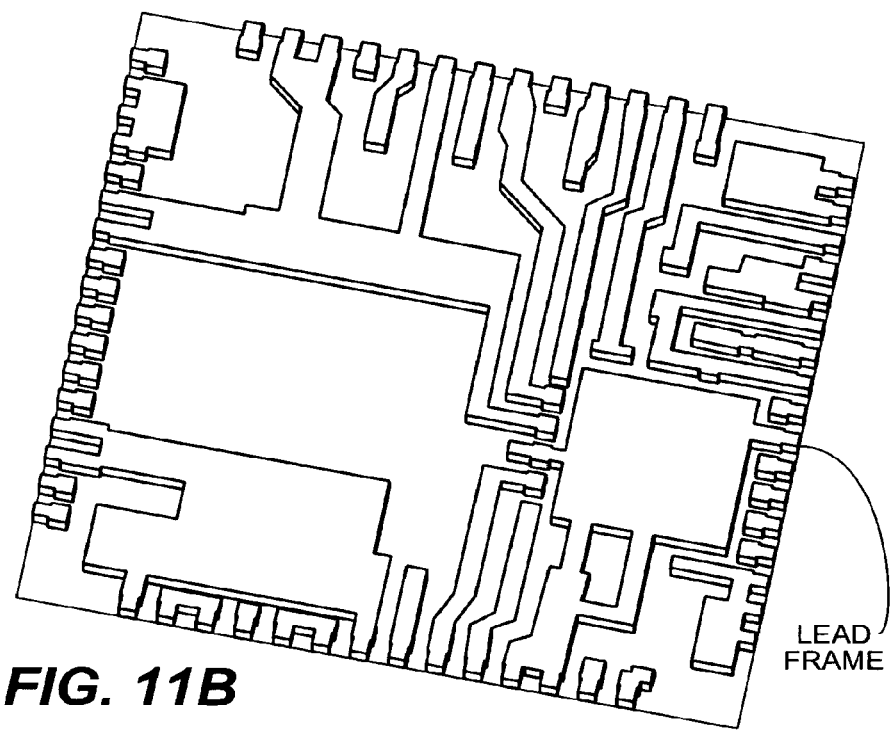
FIG. 11B illustrates a perspective view of a leadframe configuration of an exemplary embodiment.

FIG. 11B illustrates a perspective view of a leadframe configuration of an exemplary embodiment. This illustrates the bottom of the system. The leadframe is metal. The leadframe is used as an effective heat sink for thermal dissipation.

Figure 12A:
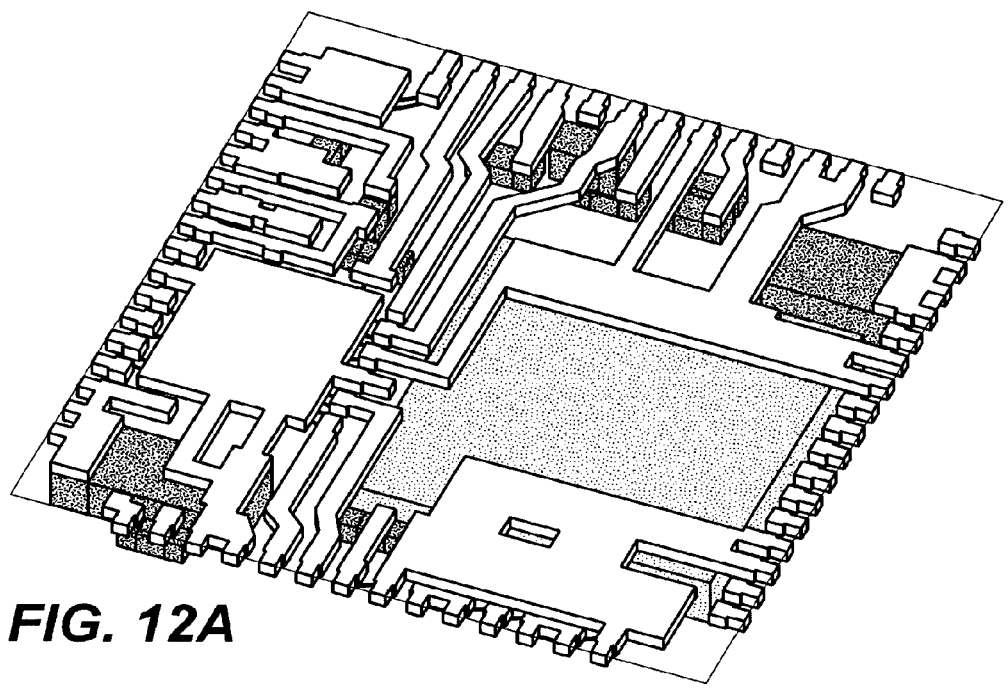
FIG. 12A illustrates a perspective view of a leadframe configuration of an exemplary embodiment.

FIG. 12A illustrates a perspective view of a leadframe configuration of an exemplary embodiment with components exposed.

Figure 12B:
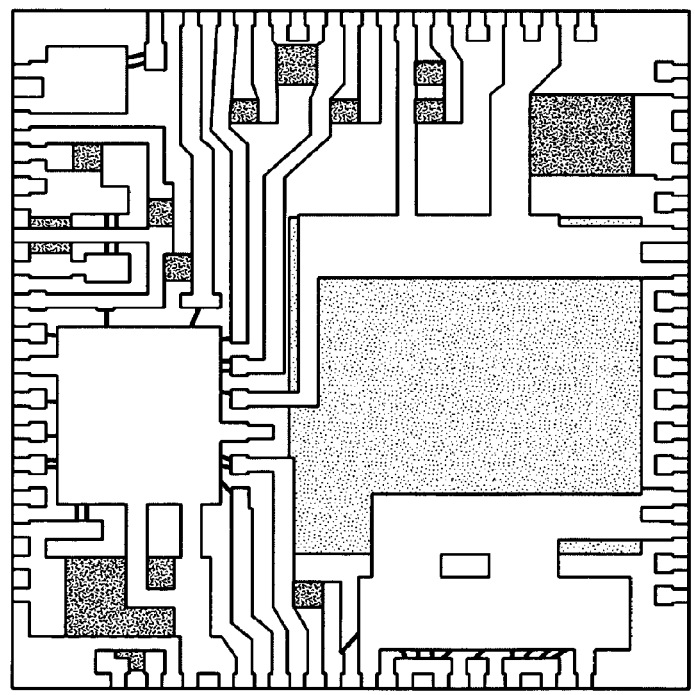
FIG. 12B illustrates a plan view of a leadframe configuration of an exemplary embodiment.

FIG. 12B illustrates a plan view of a leadframe configuration of an exemplary embodiment. This illustrates the bottom of the system. The leadframe is metal. The leadframe is used as an effective heat sink for thermal dissipation.

The foregoing descriptions of specific embodiments, complete power management system implemented in a single surface mount package, have been presented for purpose of illustration and description. They are not intended to be exhaustive or to limit the disclosure to the precise form disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A circuit package comprising:
    an integrated circuit;
    a transistor;
    a plurality of passive components; and
    a metal leadframe including a side portion to form external connections,
    wherein said integrated circuit, said transistor, and said plurality of passive components are surface mounted on said metal leadframe,
    wherein said integrated circuit, said transistor, said plurality of passive components, and said metal leadframe are encapsulated,
    wherein said integrated circuit, said transistor, and said plurality of passive components are functionally coupled as an integrated power management system.

2. The circuit package of claim 1, wherein said integrated circuit comprises a controller integrated circuit.

3. The circuit package of claim 1, wherein said transistor comprises a MOSFET transistor.

4. The circuit package of claim 1, wherein said plurality of passive components comprise a diode.

5. The circuit package of claim 1, wherein said plurality of passive components comprise an inductor.

6. The circuit package of claim 1, wherein said metal leadframe includes a bottom surface having an exposed portion.

7. A circuit package comprising:
    a plurality of components; and
    a metal leadframe including a side portion to form external connections and a bottom surface having an exposed portion,
    wherein said plurality of components are surface mounted on said metal leadframe,
    wherein said plurality of components and said metal leadframe are encapsulated,
    wherein said plurality of components are functionally coupled as an integrated power management system.

8. The circuit package of claim 7, wherein said plurality of components include:
    a plurality of passive components, an integrated circuit, and a transistor functionally coupled as said integrated power management system.

9. The circuit package of claim 8, wherein said integrated circuit comprises a controller integrated circuit.

10. The circuit package of claim 8, wherein said transistor comprises a MOSFET transistor.

11. The circuit package of claim 8, wherein said plurality of passive components comprise a diode.

12. The circuit package of claim 8, wherein said plurality of passive components comprise an inductor.

13. The circuit package of claim 7, wherein said exposed portion provides heat dissipation.

14. A circuit package comprising:
    an integrated power management system; and
    a metal leadframe including a side portion to form external connections and a bottom metal surface including an exposed portion.

15. The circuit package of claim 14, wherein said integrated power management system includes:
    an integrated circuit;
    a transistor; and
    a plurality of passive components,
    wherein said integrated circuit, said transistor, and said plurality of passive components are surface mounted on said metal leadframe, and
    wherein said integrated circuit, said transistor, said plurality of passive components, and said metal leadframe are encapsulated.

16. The circuit package of claim 15, wherein said integrated circuit comprises a controller integrated circuit.

17. The circuit package of claim 15, wherein said transistor comprises a MOSFET transistor.

18. The circuit package of claim 15, wherein said plurality of passive components comprise a diode.

19. The circuit package of claim 15, wherein said plurality of passive components comprise an inductor.

* * * * *